US011467187B2

(12) United States Patent
Brusius et al.

(10) Patent No.: US 11,467,187 B2
(45) Date of Patent: Oct. 11, 2022

(54) MULTIPHASE CURRENT MEASURING APPARATUS AND METHOD FOR MULTIPHASE CURRENT MEASUREMENT

(71) Applicant: Sensitec GmbH, Lahnau (DE)

(72) Inventors: Matthias Brusius, Hartenrod (DE); Claudia Glenske, Leungermany (DE)

(73) Assignee: Sensitec GmbH, Lahnau (DE)

( * ) Notice: Subject to any disclaimer, the term of this patent is extended or adjusted under 35 U.S.C. 154(b) by 100 days.

(21) Appl. No.: 16/766,183

(22) PCT Filed: Jan. 8, 2019

(86) PCT No.: PCT/EP2019/050324
§ 371 (c)(1),
(2) Date: Dec. 21, 2020

(87) PCT Pub. No.: WO2019/137902
PCT Pub. Date: Jul. 18, 2019

(65) Prior Publication Data
US 2021/0109132 A1 Apr. 15, 2021

(30) Foreign Application Priority Data
Jan. 12, 2018 (DE) ...................... 10 2018 100 689.6

(51) Int. Cl.
*G01R 15/20* (2006.01)
*G01R 19/00* (2006.01)
(52) U.S. Cl.
CPC ......... *G01R 15/205* (2013.01); *G01R 15/207* (2013.01); *G01R 19/0092* (2013.01)
(58) Field of Classification Search
CPC . G01R 15/205; G01R 15/207; G01R 19/0092
See application file for complete search history.

(56) References Cited

U.S. PATENT DOCUMENTS 6,310,470 B1 * 10/2001 Hebing ............... G01R 15/205
324/117 R
7,898,240 B2 * 3/2011 Shibahara ........... G01R 15/202
324/117 R
(Continued)

FOREIGN PATENT DOCUMENTS

DE 19748550 A1 10/1998
DE 10043171 A1 4/2001
(Continued)

OTHER PUBLICATIONS

International Search Report dated Mar. 21, 2019; International Application No. PCT/EP2019/050324.

*Primary Examiner* — Dominic E Hawkins
(74) *Attorney, Agent, or Firm* — Dinsmore & Shohl LLP

(57) ABSTRACT

A multiphase current measuring apparatus and method for measuring current of a multiconductor current system with N current conductors, where N>2, by determining a magnetic field strength difference in a measurement plane between conductor currents of adjacent current conductors by using the multiphase current measuring apparatus having N−1 magnetoresistive gradient sensors. At least one bypass conductor of at least one of the further current conductors is arranged with respect to each magnetoresistive gradient sensor for compensating a DC field component of the two adjacent current conductors. The DC component of the conductor currents of the two adjacent current conductors is suppressed by passing a bypass current of the at least one further current conductor through the bypass conductor symmetrically through the measurement plane of the magnetoresistive gradient sensor.

17 Claims, 7 Drawing Sheets

(56) References Cited

U.S. PATENT DOCUMENTS

| | | | |
|---|---|---|---|
| 8,975,889 B2* | 3/2015 | Ausserlechner | G01R 33/093 |
| | | | 324/117 H |
| 2012/0187943 A1 | 7/2012 | Ausserlechner et al. | |
| 2019/0011287 A1* | 1/2019 | Schmitt | G01R 33/096 |

FOREIGN PATENT DOCUMENTS

| | | |
|---|---|---|
| EP | 0597404 A2 | 5/1994 |
| EP | 0874244 B1 | 1/2002 |
| EP | 3141913 A1 | 3/2017 |

\* cited by examiner $\overline{L1}$  $\overline{L2}$  $\overline{L3}$

——— GRADIENT   [°]
---- COMMON-MODE-COMPONENT

MULTIPHASE CURRENT MEASURING APPARATUS AND METHOD FOR MULTIPHASE CURRENT MEASUREMENT

CROSS-REFERENCE TO RELATED APPLICATIONS

This application is the U.S. national stage of PCT/EP2019/050324 filed Jan. 8, 2019, which claims priority of German Patent Application 102018100689.6 filed Jan. 12, 2018 both of which are hereby incorporated by reference in their entirety.

FIELD OF THE INVENTION

The invention relates to a current measuring apparatus for measuring currents of multiconductor current system with N current conductors where N>2 and N−1 magnetoresistive gradient sensors and to an associated measuring method, in particular for high-current measurement.

BACKGROUND OF THE INVENTION

A method and a multiphase current measuring apparatus which measure a magnetic field strength difference in a measurement plane between conductor currents of adjacent current conductors by means of magnetoresistive gradient sensors are already known from the prior art.

DE 197 48 550 A1 and EP 0 874 244 B1 accordingly describe a method and a multiphase current measuring apparatus in which electrical currents in N conductors can be measured with N−1 magnetoresistive gradient sensors. A compact structure of a current measuring apparatus may be achieved in this manner, wherein the total current can be determined on the basis of a gradient magnetic field measurement between respectively adjacent current conductors with current conductors and N−1 gradient sensors. Explicit reference is to this end made to the disclosure content of the above-stated documents which provide a more detailed explanation of the principle of differential current measurement.

DE 197 48 550 A1 describes a method for measuring electrical currents in n conductors and an apparatus for carrying out the method. The currents in the n conductors are measured with n−1 magnetoresistive sensors, wherein the sensors are configured as a gradiometer for measuring the magnetic field strength differences generated by a conductor current or a plurality of conductor currents.

EP 0 597 404 A2 describes a method and a device for determining the conductor currents of a multiconductor system. The method is based on instrumental detection of vectorial magnetic field strengths in a summated magnetic field of a multiconductor system. The individual conductor currents are calculated on the basis of the measured field strengths. A measurement arrangement for carrying out the method comprises a number of sensors equivalent to the number of conductors or, in the case of a three-phase system, also only two sensors, which are arranged in the summated magnetic field close to the three-conductor system and within a magnetic shielding device and are connected with an evaluation device.

It has, however, been found in practical use that the prior art current measuring apparatus is error-prone, in particular when measuring high currents which may reach several hundred amperes per current conductor. Accordingly, when the current measuring apparatus disclosed in the above-stated documents is for example applied to the measurement of currents of over 600 A peak in a three-conductor system, a high level of inaccuracy is found which means that the above-stated method is virtually unusable for current measurement of >100-500 A peak current per current phase. The reason for this is an attempt to make the measurement apparatus as compact as possible for practical use. In such a highly compact current measuring apparatus as that shown for example in FIG. 1, the spacing between the individual current conductors 12 is so small that a DC field between adjacent current conductors 12, which is created by a current oriented in the same direction in the two current conductors, shifts the operating point of the gradient sensor 14 into a nonlinear characteristic curve range, such that appreciable current measurement distortion and inaccuracy occur at high currents of above 100 A peak.

If, on the other hand, the spacing between the individual current conductors is increased, the gradient field is reduced which in turn leads to inaccurate measurement results. This also greatly increases the installation space, wherein enlarging the measurement area is out of the question for many applications.

A maximum DC field always occurs when adjacent current conductors with a gradient sensor arranged between them carry a current of identical intensity in the same direction. If the DC field distinctly exceeds the field gradients, a characteristic curve of a gradient sensor may be shifted into a nonlinear range in which a current gradient cannot be accurately determined. In particular in rotating field applications of three or more phases, this may occur twice or more during a period. A compensating device which creates a counter magnetic field by closed-loop control in order to compensate the effect of a DC field cannot achieve sufficient correction at the above-stated high current values, such that nonlinear distortion occurs in the measurement results.

Against the background of the above-stated prior art, the problem thus arises that when magnetoresistive gradient sensors are applied to current determination in N current conductors by means of N−1 gradient sensors and if a specific current intensity is exceeded, distortion may occur which makes use impossible for high-current applications in a multiphase current system.

The object of the present invention is accordingly to solve the above-stated problems and to improve the prior art current measuring apparatus in such a manner that even in high-current applications accurate and precise current measurement can be enabled even with a compact structure of the current measuring apparatus.

BRIEF SUMMARY OF THE INVENTION

The invention is based on a multiphase current measuring apparatus for measuring currents of a multiconductor current system with N current conductors where N>2, comprising N−1 magnetoresistive gradient sensors for determining a magnetic field strength difference in a measurement plane between conductor currents of adjacent current conductors.

It is proposed that at least one bypass conductor of at least one of the further current conductors is arranged with respect to each magnetoresistive gradient sensor for compensating a DC field component of the two adjacent current conductors.

In other words, a per se known multiphase current measuring apparatus is proposed which has a plurality of current conductors, wherein a magnetoresistive gradient sensor is arranged in each case between two adjacent current conductors. The gradient sensor measures a magnetic difference field between the two adjacent current conductors. If DC currents of identical magnitude are flowing in the same direction in the two current conductors, no gradient field is measured. If currents of differing intensity or currents in different directions are flowing between the two current conductors, a correspondingly higher magnetic difference field is measured. The fundamental mode of operation of such a current measuring apparatus is already known in the prior art.

At high currents and in the case of a high identically oriented current component of the two adjacent current conductors, a high magnetic DC field is obtained at the gradient sensor which, while it does not bring about a magnetic gradient, is however capable of displacing the linear operating point of the gradient sensor into a nonlinear range, at least if the DC field component is distinctly higher than a difference field component of the parallel phase currents. In order to compensate nonlinear distortion, the invention provides that at least one bypass conductor of at least one further current conductor, which is not adjacent to the gradient sensor but is instead arranged further away, is guided into the region of the gradient sensor, such that the resultant DC field component of the two adjacent current conductors can be compensated in this way.

For example in a three-phase system, a current of an exactly identical magnitude and in the same direction may arise between two current phases L1 and L2 at phase angles of 30° and 210°, as shown in FIG. 3. At these phase angles, a gradient sensor which is arranged between the two current phases L1 and L2 would see a high DC field component (common-mode component) which would shift a linear operating range of the sensor into a nonlinear distorted range. High-current measurement is thus virtually impossible to perform at high currents which may for example amount to higher than several hundred amperes peak, in particular higher than 600 A peak. At these phase points, an opposite current simultaneously flows back through the other current conductors since, according to Kirchhoff's first law, the sum of all currents amounts to zero, and likewise generates therein an (oppositely oriented) DC field component, such that, in sum, all the DC field components balance each other out. If at least one, in particular all, of the remaining current conductors bring a bypass conductor into the vicinity of the gradient sensor, the prevailing DC field of the gradient sensor can be distinctly reduced and a linear operating range thus maintained. As a consequence, even high current components can be accurately measured without linear distortion.

In one advantageous embodiment of the multiphase current measuring apparatus, at least one bypass conductor or a group of bypass conductors may be arranged symmetrically with regard to the measurement plane of the magnetoresistive gradient sensor. In this way it is possible to ensure that a bypass magnetic field generated by the at least one bypass conductor or the group of bypass conductors does not bring about a gradient measurement signal of the magnetoresistive gradient sensor. A magnetoresistive gradient sensor is generally constructed such that two spatially definable regions can be identified, between which a magnetic gradient field, i.e. a deviation from the magnetic field acting between these regions, can be measured. Adjacent thereto, a spatial region in the measurement plane is definable in which a gradient sensor cannot measure any difference since this region is located symmetrically to the gradient regions of the magnetoresistive sensor. This brings about a "neutral" region of the measurement plane, in which a symmetrical magnetic field has no effect on a gradient measurement signal of the gradient sensor. Since the invention relates to the suppression of a DC field component of the magnetic field which exists between two current conductors acting in the gradient regions, it is particularly advantageous to locate the bypass conductor which serves to reduce the DC component of the gradient magnetic field in this "neutral" region of the measurement plane, namely symmetrically with regard to the measurement plane of the magnetoresistive gradient sensor. A magnetic field acting therein thus brings about no change in the gradient measurement signal, but does act to eliminate or reduce the magnitude of a DC field component of the magnetic field which arises between the two current conductors located in the gradient regions. It is thus possible, without influencing the overall measurement signal, to reduce the DC field component and thus transfer the measurement range of the gradient sensor into a linear range.

In one advantageous embodiment, the current component of a conductor current of the current conductor passable through a bypass conductor of a current conductor may be adjustable, in particular by a cross-sectional reduction, an insulation region and/or a resistance region of the portion of the current conductor bypassed by the bypass conductor. For the purpose of effective adjustment of the current flowing through the bypass conductor, which current is intended to reduce a DC field component of the gradient field between two adjacent current conductors, it is advantageous to define the quantity of current of the bypass conductor, in particular to carry out a calibration with regard to a predeterminable high-current measurement range. The quantity of current charge may to this end be defined by influencing the resistance in the conductor portion of the current conductor, the current of which is to be led off through the bypass conductor and carried in one of the adjacent current conductors in the region of the gradient sensor located there. This influence on resistance, which has a direct effect on the current component flowing through the bypass conductor, may be achieved for example by a reduction in the cross-section of the current conductor which is bypassed by the bypass conductor. It is also possible to provide an insulation region, for example by stamping out or removing material in the region bypassed by the bypass conductor. It is moreover possible to use a material with an elevated resistance in this region, for example aluminium instead of copper or a suitable alloy with a slightly lower conductance than the bypass conductor, such that it is possible to adjust the percentage proportion of current which flows, not through the conductor portion, but instead through the bypass conductor. In general, the current intensity through the bypass conductor is distinctly lower than the current intensity through the part of the current conductor bypassed by the bypass conductor. For example, 20%, preferably 10% or less of the current guided through by the current conductor may be guided through the bypass conductor. Accordingly, only a slight increase in the resistance of the region of the current conductor which is bypassed by the bypass conductor is required.

In a further advantageous embodiment, all the magnetoresistive gradient sensors of the current measuring apparatus may be arranged along an axis orthogonal to the longitudinal extent of the current conductor. In this embodiment, an orthogonal axis may be laid through all the current conductors which a multiphase system comprises. Along this orthogonal axis, the gradient sensors are arranged adjacent and parallel to one another between in each case two current conductors. This results in a symmetrical structure of all the field gradient sensors which are located adjacent one another and in each case overlap two current conductors which are directly adjacent to one another. All the field gradient sensors are arranged along an axis which is oriented at right angles to the current conductors, whereby identical conditions may be established.

Alternatively to the above-stated embodiment, it is likewise advantageous for the magnetoresistive gradient sensors to be arranged offset relative to the longitudinal extent of the current conductor. In the above-stated embodiment, the problem namely arises that the bypass conductors of in each case non-directly adjacent current conductors have to extend along the orthogonal axis in each case below the field gradient sensors. This results in the bypass conductors repeatedly overlapping one another, so requiring a multilayer structure or a complex current conductor layout of the bypass conductors. Overlaps of the bypass conductors can be avoided by an arrangement of the gradient sensors which is offset in the longitudinal extent of the current conductors. While this does indeed spatially lengthen the current measuring apparatus in the longitudinal extent of the current conductors, a more compact structure may be achieved and a multilayer structure of the bypass conductor layout avoided.

The two above-stated embodiments may thus be selected either for a compact design or a complex structure and a symmetrical embodiment and configured accordingly depending on the field of application.

In one advantageous embodiment of the invention, the gradient sensors can be arranged above an insulator layer and the current conductors and/or the bypass conductors below the insulator layer, wherein a feed conductor of the bypass conductors is preferably guided above the insulator layer. This further development proposes an at least two-layer structure of the current measuring apparatus, wherein an insulator layer, for example a PCB or another insulator layer is used, on the underside of which the current conductors can be guided. The bypass conductors, which are located below the magnetoresistive gradient sensors, may also be guided below the insulator layer. The gradient sensors, in each case arranged between two adjacent current conductors and in the region of each of which is guided at least one bypass conductor parallel to the current conductors, are placed above the insulator layer. The bypass conductors are electrically connected to a further, non-immediately adjacent current conductor. The feed conductors to this further current conductor may be guided for example above the insulator layer, such that a technically conventional two-layer structure of a PCB can be used. This gives rise to an inexpensive and technologically straightforwardly manufacturable multiphase current measuring apparatus.

In a further preferred embodiment, the feed conductors of the bypass conductors may extend in different conduction planes below and/or above the measurement plane of the magnetoresistive gradient sensors and current conductors, and the bypass conductors substantially extend in the plane of the current conductors and parallel to the current conductors. This embodiment proposes that both the current conductors and the bypass conductors extend in the same plane and parallel to one another. The feed conductors, which may generally be arranged at right angles to the current conductors and to the bypass conductors, may be arranged in different conduction planes below or above said measurement plane and may for example accordingly furthermore be arranged below the current conductors and/or above the current conductors, for example at the level of the gradient sensors. As a result, a multilayer structure is proposed which may in particular be used when all the gradient sensors are arranged along an axis orthogonal to the current conductors since in this case at least two or more bypass conductors are contacted with feed conductors and the feed conductors in each case intersect a further bypass conductor. A two-, three- or multilayer structure of the current measuring apparatus may thus be appropriate for achieving a compact design. A further advantage of a multilayer structure arises from the feed conductor thus being further away from the field gradient sensors and its parasitic magnetic field may have a reduced influence on the measured values of the gradient sensors.

In a further advantageous embodiment, a plurality of bypass conductors may be arranged horizontally or vertically adjacent with regard to the measurement plane of the magnetoresistive gradient sensor. The measurement plane of the magnetoresistive gradient sensors is the plane in which the two parallel guided current conductors, between which a gradient field is to be measured, are guided. The bypass conductor is preferably also guided in this measurement plane with said bypass conductor however being located in a symmetrical arrangement with regard to the gradient regions detected by the gradient sensor. This embodiment proposes that, in the case of a multiphase current measuring apparatus with N>3 current conductors, wherein with regard to said apparatus at least two or more bypass conductors are necessary for each gradient sensor and said bypass conductors may be arranged either horizontally or vertically adjacent or concentrically to one another and be arranged symmetrically to the gradient sensor in relation to this measurement plane. It is thus proposed that the bypass conductors may be guided in the measurement plane either parallel adjacent to one another or stacked on one another or in the form of a multilayer coaxial arrangement below the gradient sensor in the neutral measurement region thereof, such that DC field components may be compensated by the various bypass conductors. A compensating magnetic field is thus generated by the bypass conductors which is brought about by the various bypass currents of the non-immediately adjacent current conductors flowing through the parallel adjacent bypass conductors. These conductors may extend parallel to one another either within the measurement plane or coaxially through the neutral region of the measurement plane. It may preferably be envisaged to guide the bypass conductors concentrically to one another, i.e. for example as in the form of a multilayer coaxial cable, in order to generate a summated magnetic field in the sensor-neutral region of the gradient sensor.

In a further advantageous embodiment, the magnetoresistive gradient sensor may comprise a, preferably adjustable, field compensating device. It is conceivable to this end for the gradient sensor to comprise, in addition to the bypass conductor, an active field compensating device which makes it possible, by application of a controllable compensating current, to establish in the gradient sensor a neutral compensating field which acts as it were on the measured value signal and on the DC field component, such that the DC field component between the two conductors can be eliminated. Thus, in addition to the bypass conductors, the gradient sensor may be actively driven in respect of compensation of the measured value range by a DC field component, wherein closed-loop control of the compensating magnetic field is advisable for this purpose. It may here be advantageous for the field compensating device to generate a DC field, or also a time-variable field which is based on the system frequency of the multiphase current system. The field compensating device may furthermore adapt the measured value range, such that various orders of magnitude of currents can also be precisely measured without distortion and inaccuracy arising in the current measurement, such that a high dynamic range of current measurement may be achieved.

In one advantageous embodiment, the current conductors and/or the bypass conductors may individually or jointly be comprised in a ferrite structure in order to predetermine a magnetic flux direction. The ferrite structure here at least in places encloses the current conductors and/or bypass conductors and purposefully guides the magnetic field thereof into the measurement region of the gradient sensor, such that it is precisely in spatially distributed bypass conductors of a multiphase current system with more than three phases that the magnetic fields of the bypass conductors can be guided into the gradient-neutral region of the field gradient sensor and shielding from parasitic fields can be provided. Stray fields may also be eliminated and field accuracy distinctly increased thereby, such that improved measuring accuracy may be achieved.

One advantageous embodiment may comprise three current conductors and two magnetoresistive gradient sensors. It is thus proposed in particular to design the current measuring apparatus for a three-phase system in which in each case just one bypass conductor is guided below one of the two gradient sensors. This results in structural simplification and the bypass conductor can be laid symmetrically through the gradient sensor exactly in the field-neutral middle region, such that very good compensation of DC field components may be achieved in a high-current, three-phase system.

An independent aspect proposes a method for multiphase current measurement preferably using a multiphase current measuring apparatus as described above, wherein N–1 magnetoresistive gradient sensors are used for measuring N conductor currents where N>2, and in each case one magnetoresistive gradient sensor with a measurement plane is arranged between two adjacent current conductors for determining a magnetic field strength difference in a measurement plane between conductor currents of adjacent current conductors. The method proposes suppressing a DC field component of the conductor currents of the two adjacent current conductors by passing a bypass current of at least one further current conductor, preferably bypass currents of all the further current conductors, symmetrically to the measurement plane of the magnetoresistive gradient sensor.

The invention accordingly proposes passing one or more bypass currents from all the further current conductors involved in the multiphase system through a measured value-neutral region of the gradient sensor, which generally corresponds to an axis of symmetry through the gradient sensor, such that the bypass magnetic field generated by the bypass currents has no gradient effect. The measurement result of the gradient sensor is consequently not influenced by the bypass currents. If a high DC component with an identical magnitude and identical direction occurs in the two adjacent current conductors which are detected by the gradient sensor, the sum of these currents flow back in the remaining current conductors involved in the multiphase current system. A bypass current which is formed and arises from a magnetic field combination of all the bypass currents of the further conductors involved compensates this DC field, such that the gradient sensor is not exposed a high DC field. It is consequently possible in structurally simple manner to avoid DC field components in high-current applications, such that precise measurement of the proposed multiphase current measuring apparatus may be achieved.

In an advantageous further development of the measurement method, the magnitude of the bypass current(s) may be adjusted by modifying the resistance of a portion of the current conductor bypassed by the bypass conductor. This adjustment may be achieved by modifying the resistance, which may for example be achieved by a cross-sectional reduction, using different materials with different resistivities or using a bypass conductor with a lower resistivity. The proportion of the bypass current to the total current which flows through one of these conductors may here be adjusted such that ideally occurring DC field components can be perfectly suppressed. It may be envisaged to this end to adapt a predeterminable current range on which the change in resistance is based. The change in resistance may be adjustable, for example structural measures may be used to adjust the resistance by an increase or decrease in the cross-section or an increase or decrease in a resistance in the portion bypassed by the bypass conductor, such that the measured value range may be optimally set. For instance, use of a voltage-dependent resistor, i.e. a varistor, may be envisaged. The change in resistance may here only be a few percent, since the bypass conductor absorbs only a few percent of the current which flows through the current conductor, or also a major difference in resistance.

In a further advantageous embodiment, the magnetoresistive gradient sensors in each case have a field compensating device which is adjustable for measurement range calibration. It is possible with the assistance of a field compensating device, which is preferably based on closed-loop control for elimination of a DC field, to adjust a predeterminable main magnetic field which thus determines the operating point of the gradient sensor. As a result of a measurement range calibration, the field compensating device can generate an adjustable magnetic field, such that the current measuring apparatus can be adjusted to different current measurement ranges.

It has advantageously been found that the bypass current amounts to less than 20%, preferably less than 10% and in particular less than 5% of the conductor current. In the light of such a small quantity of current, the bypass conductors may have a relatively small cross-section and the bypass conductors need not have a high current carrying capacity, such that insulation gaps and materials may be of correspondingly smaller dimensions. A structurally simple and inexpensively producible current measuring apparatus may be provided as a consequence.

BRIEF DESCRIPTION OF THE DRAWING

Further advantages are revealed by the present description of the drawings. The drawings show exemplary embodiments of the invention. The drawings, description and claims contain numerous features in combination. A person skilled in the art will expediently also consider the features individually and combine them into meaningful further combinations.

In the drawings.

Identical elements are denoted with the same reference signs in the figures. The figures merely show examples and should not be understood as being limiting.

DETAILED DESCRIPTION OF THE INVENTION

Figure 1:
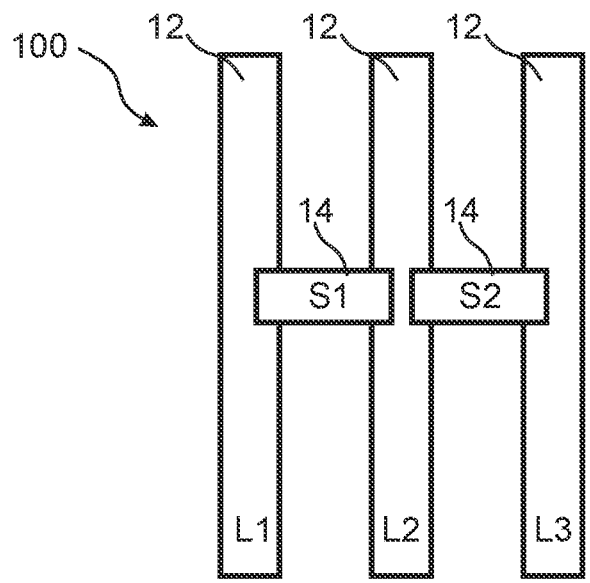
FIG. 1 is a schematic showing plan view of a configuration of a prior art three-phase current measuring apparatus.

FIG. 1 shows a three-phase current measuring apparatus 100 known from the prior art. The current measuring apparatus 100 comprises three parallel guided current conductors 12 which in each case carry a current phase L1, L2 and L3 of the three-phase current system. A magnetoresistive gradient sensor 14, S1, which measures a gradient magnetic field between the two current conductors 12 L1-L2, is inserted between the current conductor 12 which carries phase current L1 and the current conductor 12 which carries phase current L2. A further gradient sensor 14, S2, for measuring the phase gradient L2-L3 is interposed between the two current conductors 12 which carry phases L2 and L3.

On the basis to the determination of the two field gradients by means of the gradient sensors 14, S1, S2, it is possible to use a sufficiently well known method to determine the total current in the three current conductors 12, since the two gradient values are in each case proportional to a difference in the phase currents of $I_1$, $I_2$ and $I_3$ of current phases L1, L2 and L3. The two gradient values $U_{S1}$ and $U_{S2}$ of the two gradient sensors S1, S2 are thus obtained from the phase currents:

$$U_{S1}=K_1 \cdot (I_1-I_2)$$

$$U_{S2}=K_2 \cdot (I_2-I_3)$$

where $K_1$, $K_2$ are proportionality factors which state the relationship of the gradient sensor measured values to the strength of the current differences and, taking account of Kirchhoff's rule:

$$\sum_{n=1}^{3} I_n = I_1 + I_2 + I_3 = 0$$

three equations with the three unknowns $I_1$, $I_2$ and $I_3$ are obtained, wherein, by summation and difference calculation of the measured values of the gradient sensors:

$$U_{S1}-U_{S2}=K_1 \cdot (I_1-I_2)-K_2 \cdot (I_2-I_3)$$

and $$U_{S1}+U_{S2}=K_1 \cdot (I_1-I_2)+K_2 \cdot (I_2-I_3)$$

with the constraint:

$$I_1+I_3=-I_2$$

and on the assumption that $K_1$ is equal to $K_2=K$, i.e. identical field gradient sensors are used, the following formula is obtained $$U_{S1}-U_{S2}=K \cdot (I_1+I_3-2I_2)=K \cdot (-3I_2)$$

Each conductor current $I_1$, $I_2$ and $I_3$ of the three current phases L1, L2 and L3 is straightforwardly obtained by appropriate further calculations.

In a multiphase system where N>3, the equation system may be appropriately extended multidimensionally to result in a linearly and positively defined equation system, such that in each case the individual conductor currents can be unambiguously determined by measuring field gradients between two adjacent currents.

Within a predefinable magnetic field range, the gradient sensors 14, S1, S2 used have a linear profile, i.e. a magnitude of the sensor measured value corresponds linearly to a difference in the currents between the adjacent current conductors. If, however, a large DC component is flowing through both current conductors, the measurement point of the gradient sensor is shifted into in nonlinear range in which either proportionality does not prevail or absolutely no gradient can any longer be measured since the magnetoresistive behaviour of the gradient sensor is saturated. Accurate measurement of high-current applications was thus not possible using the current measuring apparatus known from the prior art shown in FIG. 1.

Figure 2:
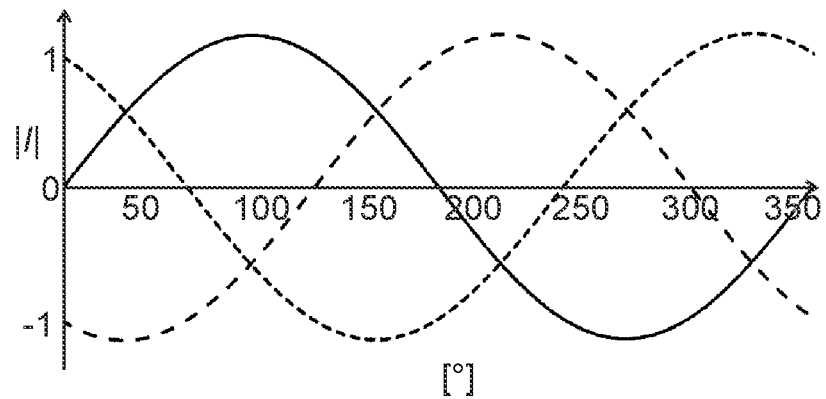
FIG. 2 is waveform representation of a typical current profile of a three-phase system.

FIG. 2 shows a typical sinusoidal profile of a three-phase system with the three currents $I_1$, $I_2$ and $I_3$ of the three current phases L1, L2 and L3. Each current is offset by 120° relative to the adjacent current.

Figure 3:
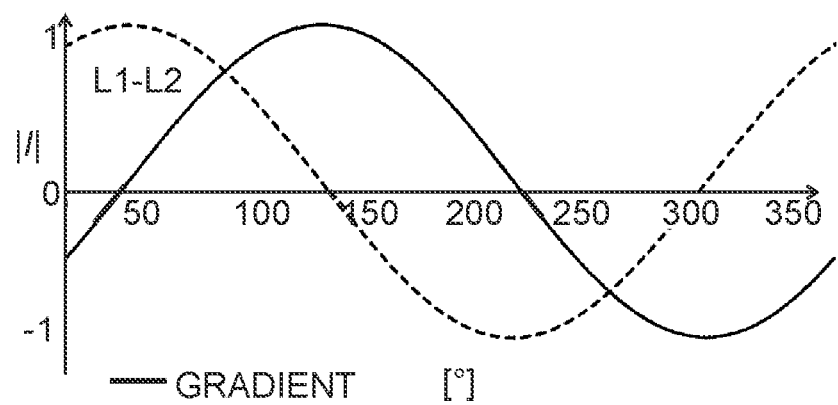
FIG. 3 is waveform representation of a gradient and DC field component which is established between current phases L1-L2 in a current profile according to FIG. 2.

FIG. 3 depicts with regard to sensor S1 14 from FIG. 1 not only the gradient field which forms between current phases L1 and L2 but also a DC field component which in each case arises from currents being carried in the same direction. It is clearly apparent that in relation to current phases L1 and L2 a maximum of the DC component is in each case achieved at 30° and at 210°. A high magnetic DC field arises in these regions, such that is hardly any longer possible for the sensor S1 14 to measure gradients accurately between these two current conductors. This gives rise to distortion and thus inaccuracy, in particular at currents which may reach several hundred amperes peak, wherein in particular in an arrangement with 600 A peak using the embodiment shown in FIG. 1 it is not possible to obtain any usable measurement results.

Figure 4:
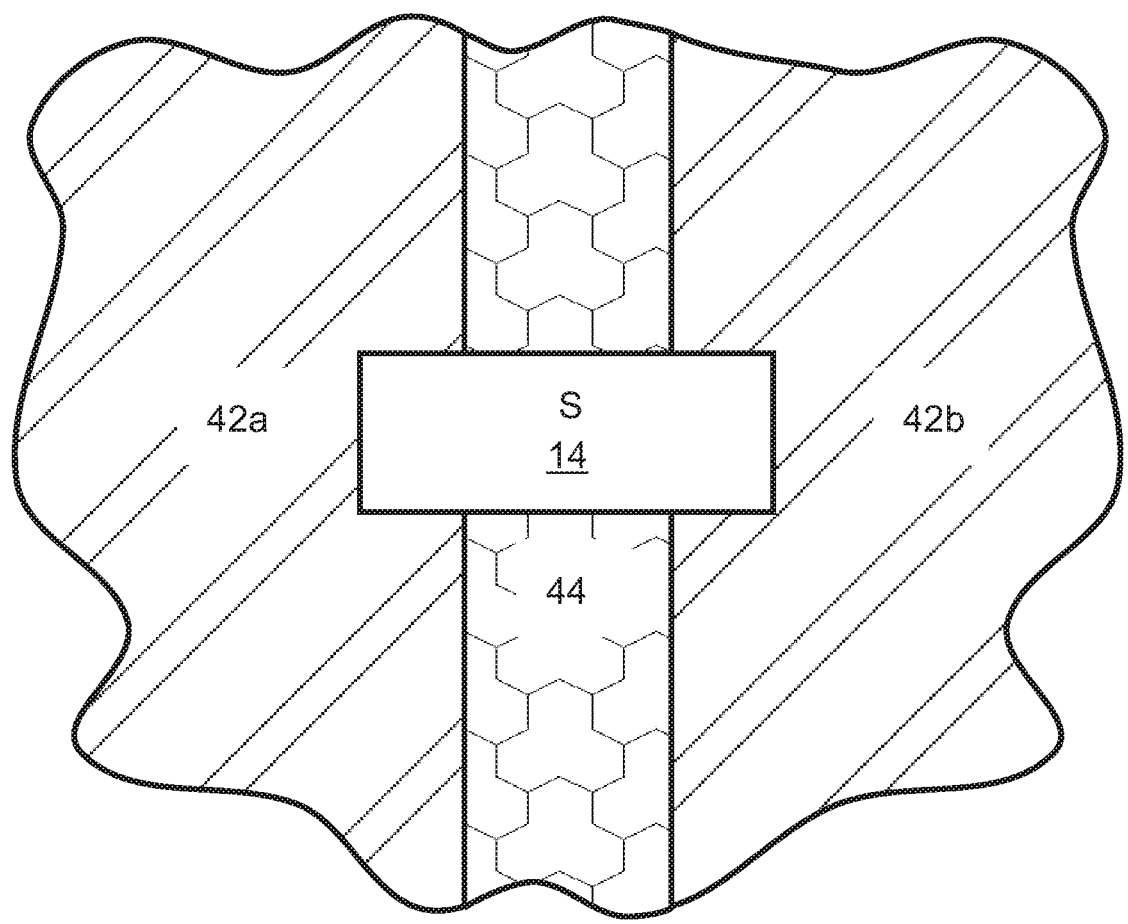
FIG. 4 is a schematic of a sensor-sensitive gradient region and a sensor-neutral region of a gradient sensor.

FIG. 4 is a schematic diagram of the measurement regions of a gradient sensor S14 of the type on which the invention is based. The measurement sensor 14 defines a spatial measurement region which comprises two gradient regions 42a and 42b. Magnetic fields which span the region 42a to 42b are detected by the sensor S14 and the difference thereof is output by the sensor S as a gradient value. A "neutral" region 44, lying symmetrically to the spatial extent of the sensor S, is located therebetween and in the region thereof magnetic field components have no appreciable effect on the sensor value. This is, as it were, a sensor value-neutral region, in which symmetrically formed magnetic fields which have no influence on the sensor value may be passed through. If a high DC field prevails in gradient regions 42*a* and 42*b*, the sensor S is hardly any longer able to detect slight differences in gradient. An opposite magnetic field may be guided in the neutral region 44 for compensation purposes, the field being designed to compensate the high DC components which prevail in both of gradient regions 42*a* and 42*b*. This makes it possible to reestablish a linear operating range in the gradient sensor S, such that an accurate measurement of the differences in gradient between gradient regions 42*a* and 42*b* can be captured.

Figure 5:
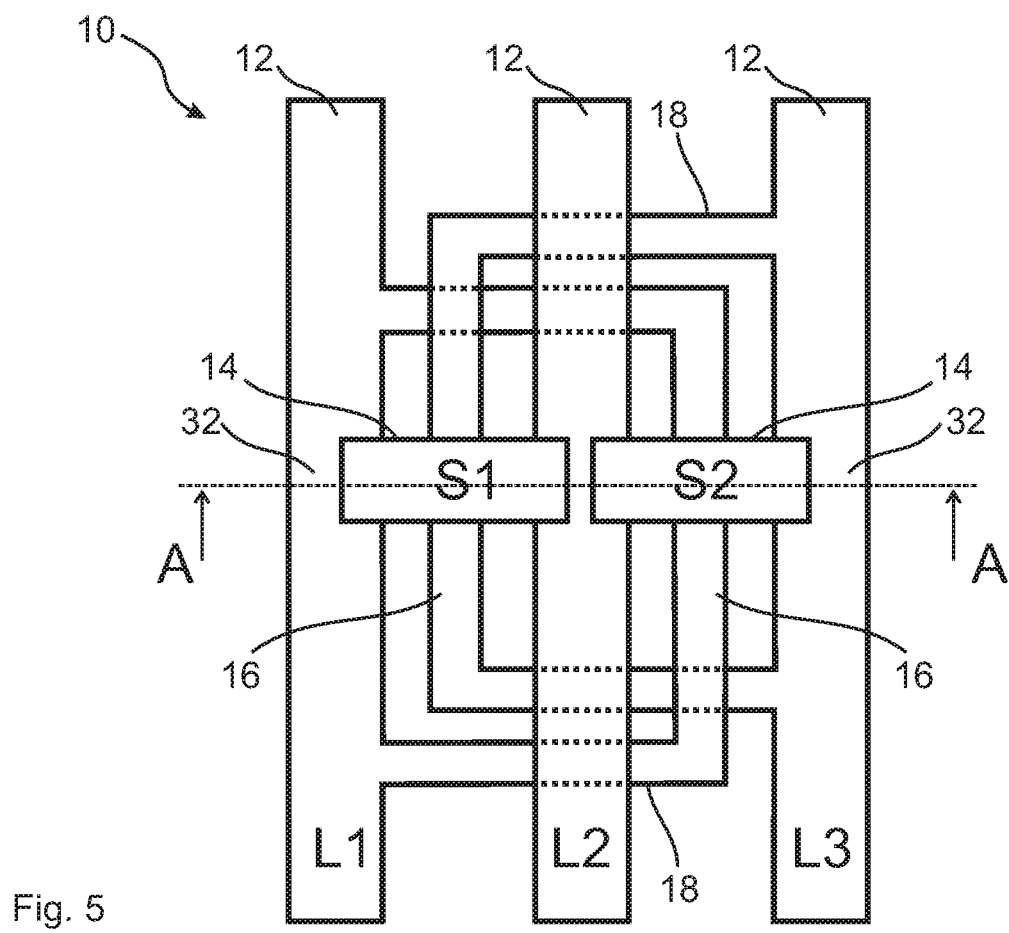
FIG. 5 is a schematic showing a first embodiment of a current measuring apparatus according to the invention.

FIG. 5 shows a first exemplary embodiment 10 of a current measuring apparatus according to the invention for a three-phase application. The three current phases L1, L2 and L3 are carried in three parallel guided current conductors 12. A gradient sensor 14, S1, S2 is arranged in each case between two adjacent current conductors 12. A current conductor portion 32 in which the gradient sensor 14 is arranged is bypassed by a bypass conductor 16. The bypass conductor 16 comprises two feed conductors 18 which depart at right angles from the current conductor 12 and pass beneath or over the respectively adjacent current conductor 12, and change over to a bypass conductor portion 16 parallel to the course of the current conductor 12 which leads through the neutral region 44 of the gradient sensor 14 of the respective non-immediately adjacent current conductor pair 12. A current component of current phase L1, which influences the field gradients between current conductors L2 and L3, is thus carried centrally in the neutral region 44 under gradient sensor S2 14. Conversely, a bypass current of phase L3, which influences the field gradients of the two current phases L1 and L2, is passed through the neutral region 44 of gradient sensor S1 14. Because the bypass conductors 16 in each case extend in the neutral region 44 of the gradient sensor 14, the currents carried therein have no influence on the sensor value. A maximum DC field of adjacent current conductors 12 occurs when the current in each case has the same intensity and same direction on adjacent current conductors 12. This applies, for example, in current phases L1 and L2 at the phase angles 30° and 210°, as shown in FIG. 3. At these points in time, the current is maximally oriented in the opposite direction on the third bar L3 12. A proportion of the current of the third phase L3 is thus carried via the bypass conductor 16 below the gradient sensor 14 and generates a DC field which is of a comparable magnitude but oriented in the opposite direction. Given the symmetrical arrangement of the bypass conductor below the gradient sensor 14, no gradient field is generated by the bypass conductor 16 but the linear operating point of the gradient sensor 14 is established.

Figure 6:
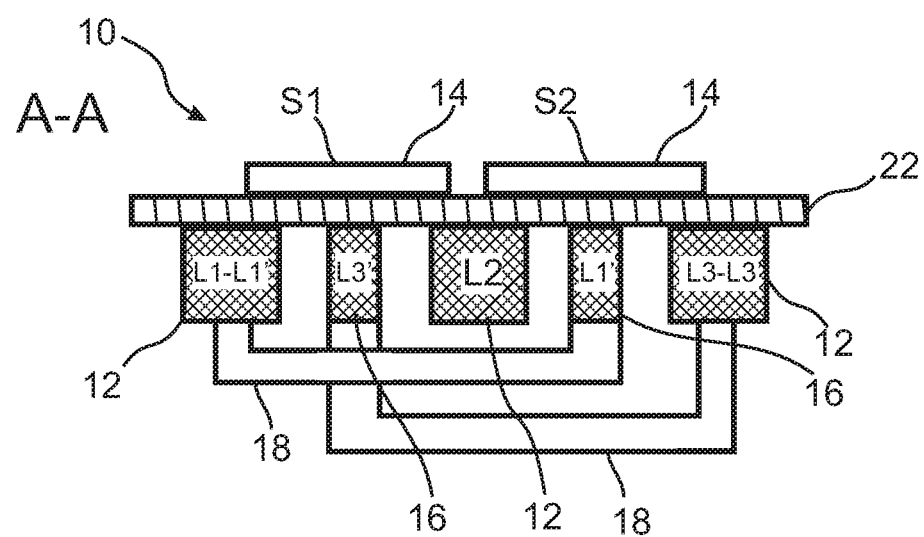
FIG. 6 is a sectional view of the current measuring apparatus shown in FIG. 5.

FIG. 5 includes a sectional plane A-A which is shown as a sectional diagram in FIG. 6. As is clearly apparent, the gradient sensors 14 are arranged on an insulator layer 22, for example a printed circuit board (PCB). The current conductors 12, which in each case carry a current phase component L1-L1', L2 and L3-L3' in the region of the orthogonal axis A-A, extend below the insulator layer. The other current phase components L1' and L3' are guided through bypass conductors 16 which are arranged symmetrically to the respective gradient sensor 14. These generate a compensating field in order to produce a counter magnetic field in the event of a high DC component in the adjacent current conductors and maintain the linear operating range of the gradient sensors 14. The feed conductors 18 are guided in two horizontally adjacent layers below the insulator layer 22 and in each case bypass the middle current conductor 12.

Figure 7:
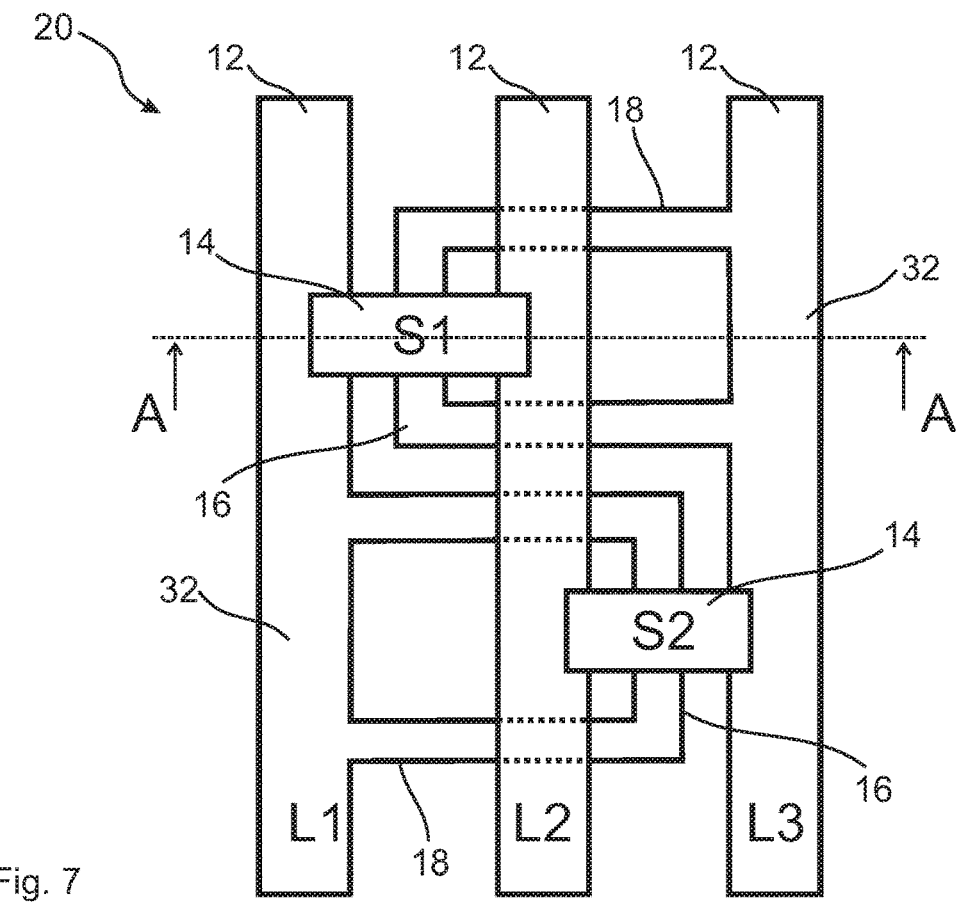
FIG. 7 is a schematic showing a further embodiment of a current measuring apparatus according to the invention.

FIG. 7 shows a further exemplary embodiment 20 of a three-phase current measuring apparatus. In contrast with the embodiment 10 shown in FIG. 5, the two gradient sensors 14 are arranged not along an axis orthogonal to the layout of the current conductors 12 but instead offset in the longitudinal direction to the current conductors 12. This makes it possible for the bypass conductors 16 and feed conductors 18 of the two bypasses not to intersect but instead be guided separately from one another. The current measuring apparatus 20 is thus enlarged in the longitudinal direction of the current conductor 12 but the structural complexity is reduced since the feed conductors 18 need not intersect any further bypass conductors 16 and thus a multilayer structure may be avoided. A simplified structure may be achieved in this manner. The respective regions 32 of the current conductors bypassed by the bypass conductors 16 are thus longitudinally offset from one another.

Figure 8A:
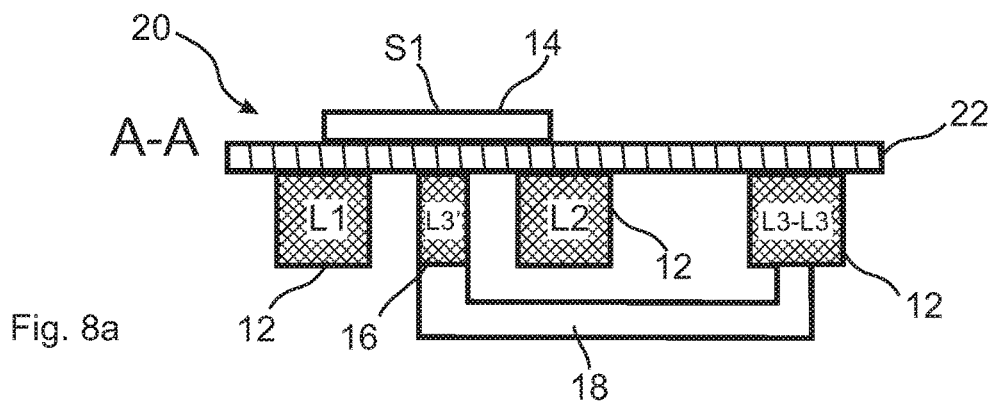
FIGS. 8a, 8b are sectional representations of various variants of the current measuring apparatus shown in FIG. 7.

FIG. 8*a* shows a sectional diagram through the orthogonal sectional line A-A shown in FIG. 7. The bypass conductor 16 is supplied by a feed conductor 18 which carries a part L3' of the current conductor L3, such that the latter carries only a current L3-L3'.

Figure 8B:
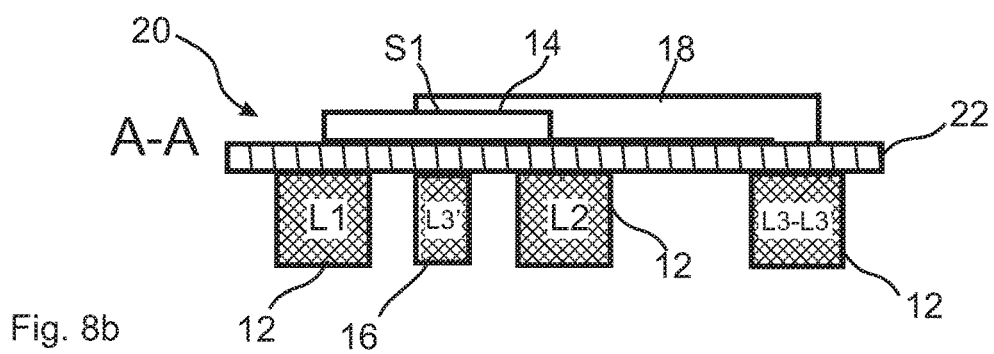

FIG. 8*b* alternatively shows that the feed conductor 18 may be guided through a via through the insulator layer 22 on the upper side of the insulator layer 22, such that an only two-layer insulator layer 22 may be used and a multilayer structure of the current measuring apparatus is avoided. Such a variant may likewise be envisaged in FIG. 6, in which one of the two feed conductors 18 is guided above the current conductor 22. In this way, a relatively inexpensive production method may be used to produce a printed circuit board coated on both sides or populated on both sides with current-carrying components in order to form the current measuring apparatus.

Figure 9:
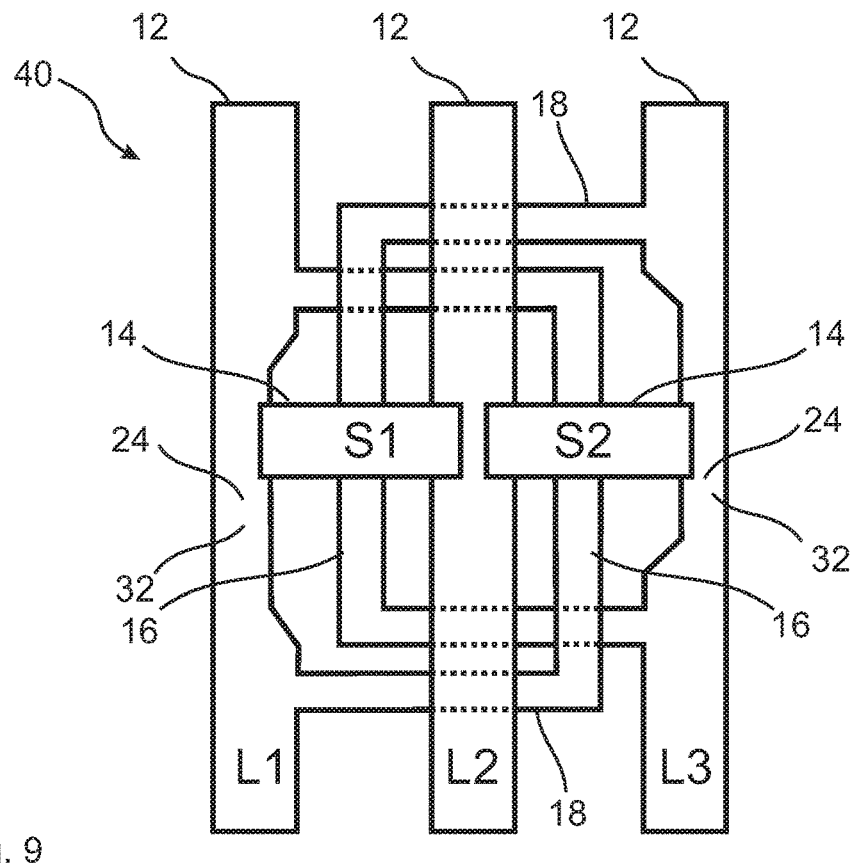
FIG. 9 is a schematic of a further exemplary embodiment of a current measuring apparatus according to the invention.

FIG. 9 shows a further exemplary embodiment 40 of a three-phase current measuring apparatus, the structure of which is based on the embodiment 10 shown FIG. 5. At variance therewith, there is a cross-sectional constriction in the region 32 of each current conductor 12 which is bypassed by a bypass conductor 16, such that a cross-sectionally reduced region 24 of the current conductor is provided. The reduction of the current conductor region slightly increases the effective resistance in this region, such that the quantity or current component which is guided through the bypass conductor 16 may be adjusted in this way. In general, it is sufficient to guide 20% or less, preferably 10%, in particular 5% of the current carried in the current conductor 12 through the bypass conductor.

Figure 10:
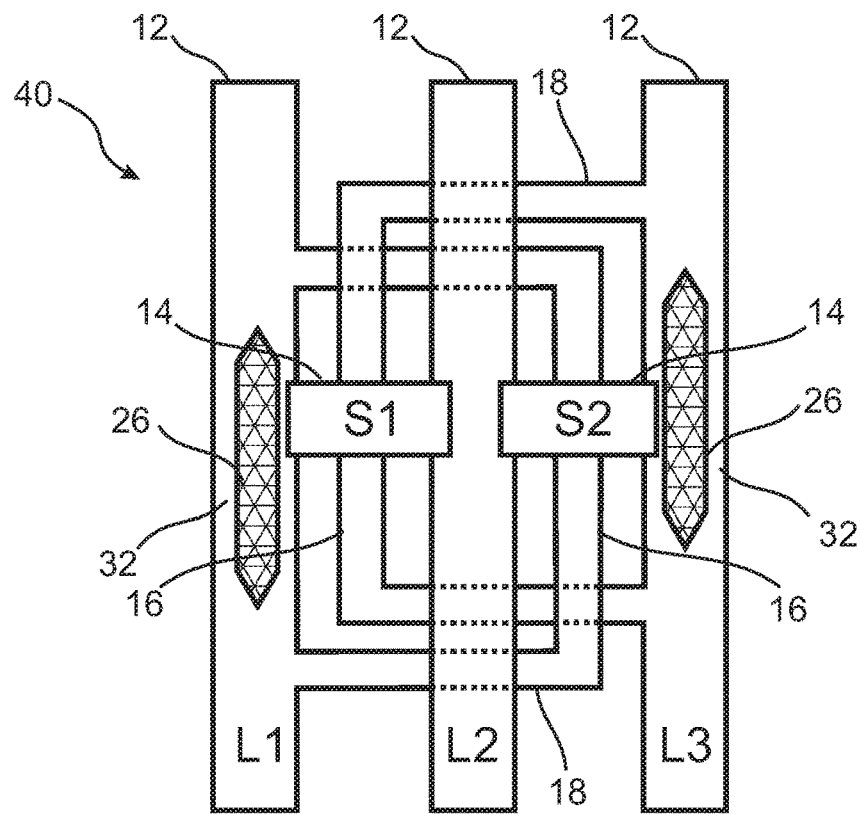
FIG. 10 is a schematic of a further exemplary embodiment of a current measuring apparatus according to the invention.

Alternatively, FIG. 10 shows a further exemplary embodiment 40 of the current measuring apparatus, in which a resistance region 26 is provided, for example by using a material with a slightly higher resistivity, in the region bypassed by the bypass conductor 32. In this way, resistance regions are formed in which for example aluminium is used instead of copper or in which a mixed alloy with a slightly higher resistance is used, such that a definable current component may be guided through the bypass conductor 16. It is alternatively conceivable to form the bypass conductor 16 from a material which has a higher conductivity such that a definable apportionment of the current through the current conductor 12 is obtained, and a current flow in the bypass conductor may be adjusted in a percentage ratio to the total current guided through the current conductor 12.

Figure 11:
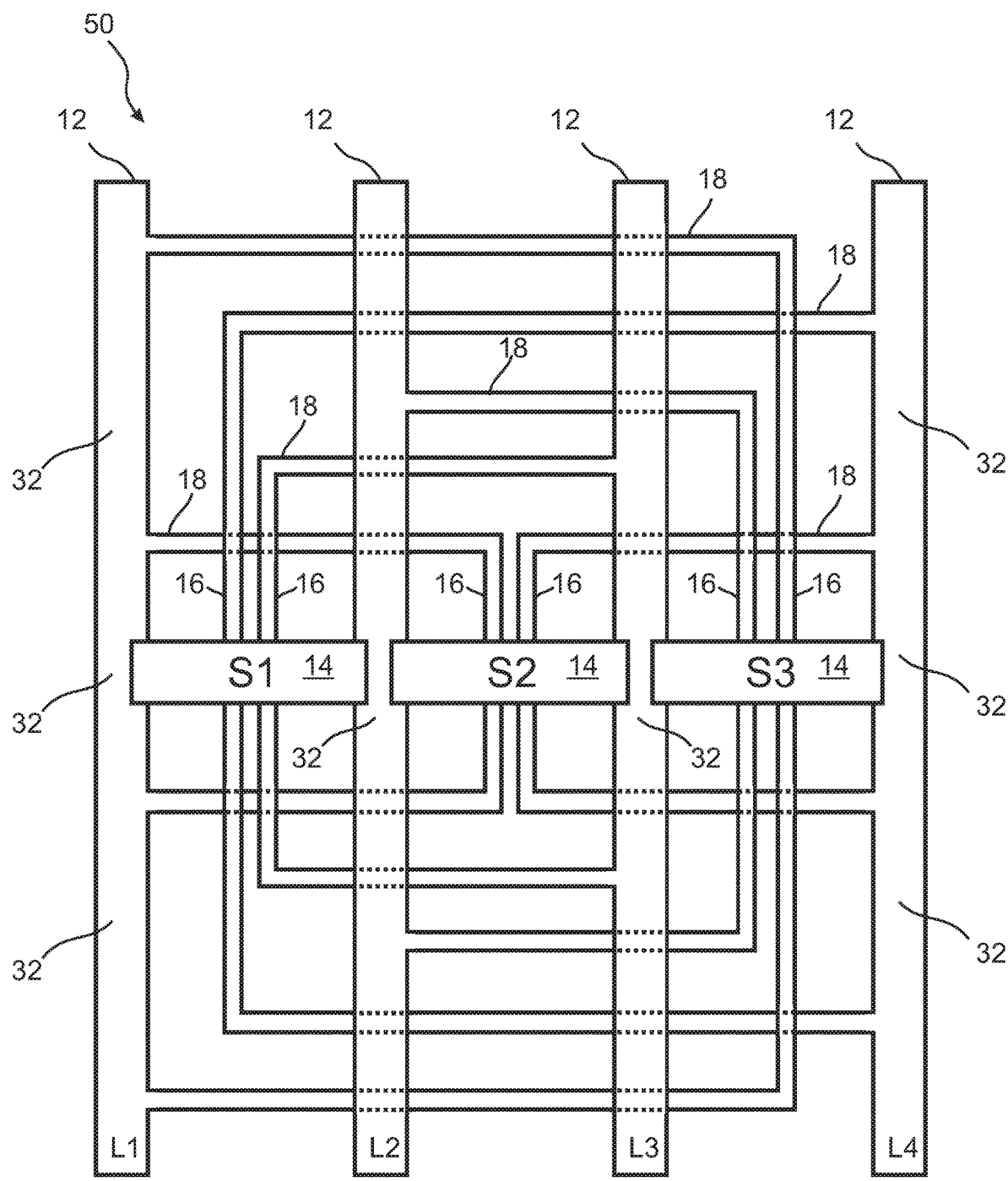
FIG. 11 is a schematic of an exemplary embodiment of a four-phase current measuring apparatus according to the invention.

FIG. 11 shows a four-phase current measuring apparatus 50 as a further exemplary embodiment of the invention. Four adjacent current conductors 12 are provided for this purpose. Each current conductor 12 carries a current phase L1, L2, L3 and L4. A gradient sensor 14 S1, S2 and S3 is in each case provided between two adjacent current conductors 12. Each gradient sensor 14 measures a gradient field between two adjacent current conductors 12. In order to compensate the DC field components, bypass conductors 16 of the respectively non-adjacent current conductors 12 are required and may be laid in the layout shown. In this example, the gradient sensors 14 are arranged on an axis orthogonal to the course of the current conductors 12. It is alternatively also conceivable to offset the gradient sensors 14 from one another such that the bypass conductors 16 do not overlap repeatedly and thus enable a structurally simplified implementation of the current conductor layout. Bypass conductors 16 of current phases L3 and L4 are thus guided through the gradient sensor 14 S1. Bypass conductors 16 of current phases L1 and L4 are thus guided through the gradient sensor 14 S2. Bypass conductors 16 of current phases L1 and L2 are thus guided through the gradient sensor 14 S3. A four-phase system may for example be used in special applications and may be scaled at will to create a five-, six- or multiphase system.

Figure 12:
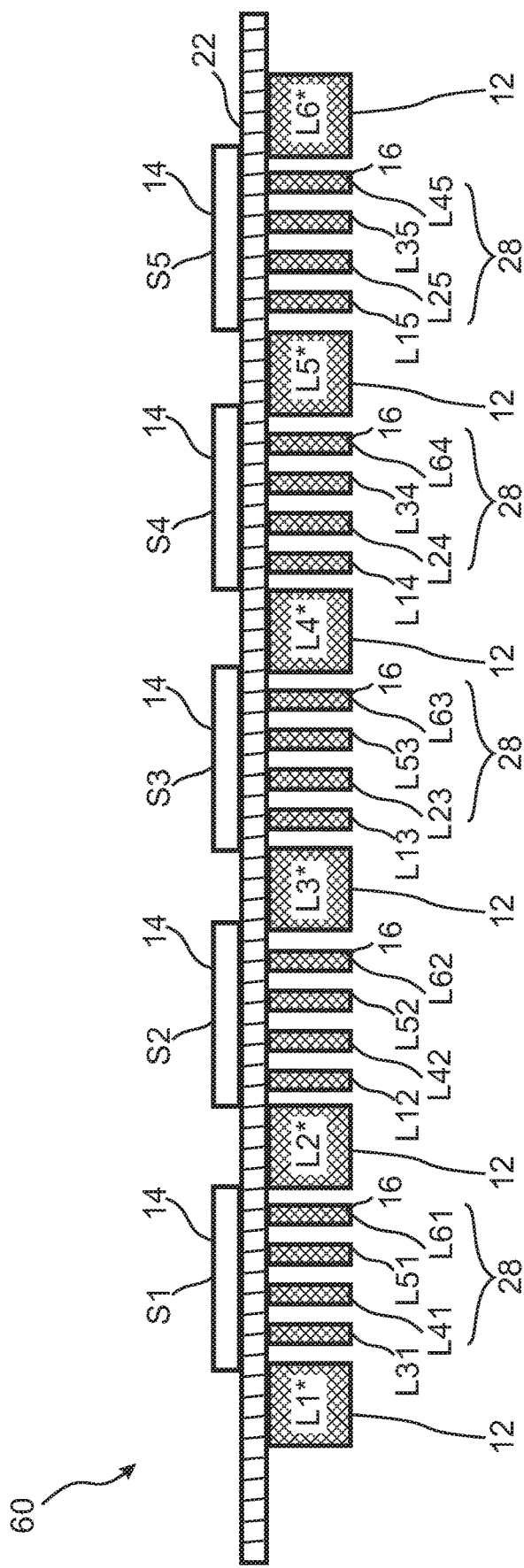
FIG. 12 is a cross-sectional view of an exemplary embodiment of a six-phase current measuring apparatus according to the invention.

FIG. 12 shows a cross-section of a further exemplary embodiment 60 of a six-phase system, in which six current phases L1 to L6 are guided below an insulator layer 22 and five gradient sensors 14, S1 to S5 are arranged in each case between the current conductors 12. Four bypass conductors 16 from the other non-immediately adjacent current conductors 12 are thus arranged in the neutral region 44 of each gradient sensor 14. Taking gradient sensor S1 by way of example, these are denoted in the nomenclature L31, L41, L51 and L61 and carry bypass currents of conductors L3, L4, L5 and L6. Groups 28 of bypass conductors which are guided in the neutral region of the gradient sensor 14 are thus obtained.

Figure 14:
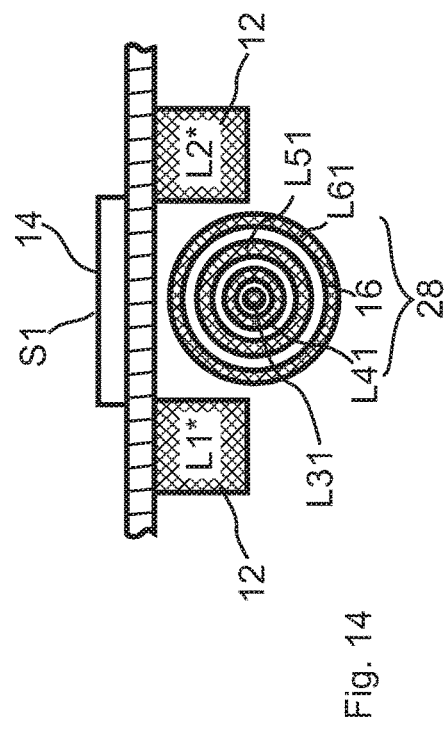
FIG. 14 is a cross-sectional partial view of a variant of the six-phase current measuring apparatus shown in FIG. 12.
Figure 13:
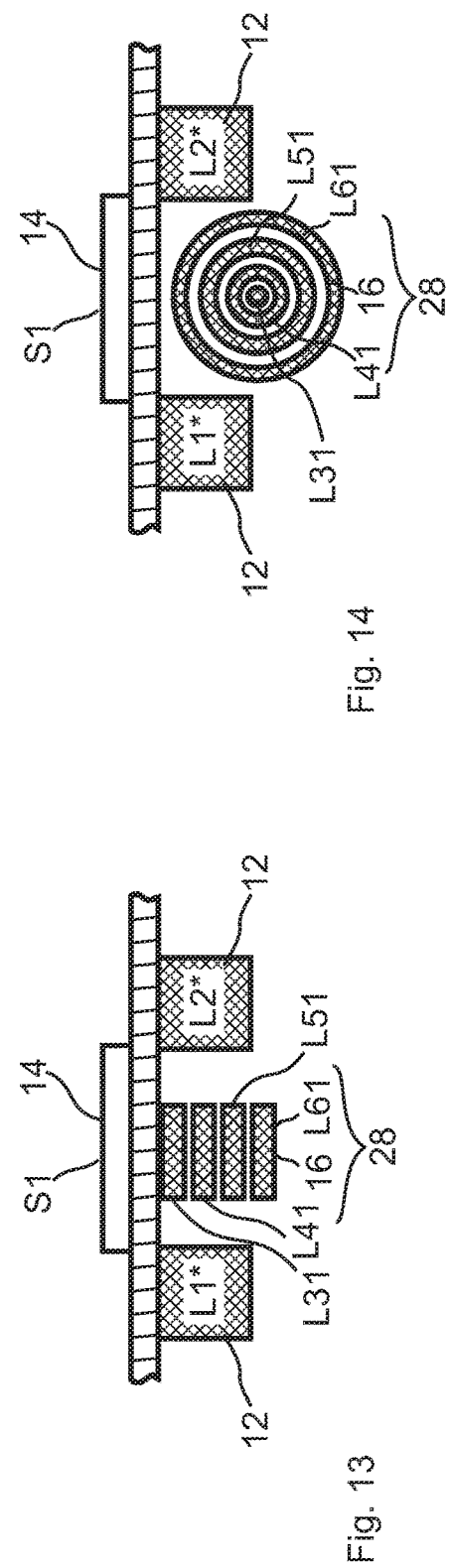
FIG. 13 is a cross-sectional partial view of an embodiment of the six-phase current measuring apparatus shown in FIG. 12.

FIGS. 13 and 14 show various embodiments of how bypass conductors 16 may be guided in the neutral region 44 of the gradient sensors 14 in the embodiment 60 of FIG. 12. While in FIG. 12 the bypass conductors 16 are guided horizontally adjacent one another in the measurement plane, they may, as shown in FIG. 13, also be stacked vertically on one another in the neutral measurement plane, or also, as shown in FIG. 14, be guided concentrically to one another in the manner of a multilayer coaxial cable. The DC field may thus be spatially concentrated in the neutral region 44 of each gradient sensor 14, such that even in multiphase applications at high currents it is possible to establish a linear measurement range of the gradient sensors 14 and so make accurate measurements.

The invention proposes, in particular for a three-phase system, but also for a multiphase system with N>3, that the current of the phase which is in each case not detected by a gradient sensor due to its phase opposition be used to compensate the [field component] between the current which generates a DC field in adjacent current conductors. A small proportion of the current is tapped from the other phase via a bypass conductor and carried symmetrically centrally directly below the gradient sensor between the phases of the adjacent current conductors. The field gradients may be arranged orthogonally on the same axis to the conductor bar, such that the current measuring apparatus requires a small footprint in the longitudinal direction. In a three-conductor system, the current in the central current bar L2 is not reduced and the two external current bars in each case carry a reduced current in a region bypassed by the bypass conductor which is guided as a compensating field through the bypass conductor. For the purposes of calculating the total current, the reduced gradient field means that these individual currents must be taken into account with corresponding factors when solving the above-stated equation system.

In an alternative variant, the gradient sensors may be offset from one another in the longitudinal direction, such that the bypass conductors do not intersect. A larger footprint in the longitudinal direction of the conductor bars is consequently required but a more compact design may be achieved with regard to the layout of the bypass conductors and the structural complexity of hardware implementation may be minimised. There is also no need in these cases to take account of the reduced gradient field per sensor, since the complete current in each case flows between the adjacent current conductors because no bypass current is diverted here. As a result, the calculation specification, based on that previously stated, is simplified.

This invention enables to make use of a three- or also multiphase current measuring apparatus purposefully for high-current applications of several hundred amperes peak per current conductor and furthermore to provide a linear modulation range of the gradient sensors. The proposed current measuring apparatus may consequently be used for any current loads, however high, so resulting in major advantages over the prior art.

LIST OF REFERENCE SIGNS

10 First exemplary embodiment of a current measuring apparatus
12 Current conductor
14 Magnetoresistive gradient sensor
16 Bypass conductor
18 Feed conductor of the bypass conductor
20 Second exemplary embodiment of a current measuring apparatus
22 Insulator layer
24 Cross-sectionally reduced current conductor region
26 Resistance region/insulation region
28 Group of bypass conductors
30 Third exemplary embodiment of a current measuring apparatus
32 Current conductor portion bypassed by the bypass conductor
40 Fourth exemplary embodiment of a current measuring apparatus
42 Gradient region
44 Neutral region
50 Fifth exemplary embodiment of a current measuring apparatus
60 Sixth exemplary embodiment of a current measuring apparatus
100 Prior art current measuring apparatus

The invention claimed is:

1. A multiphase current measuring apparatus for a multiconductor current system with N current phases and N>2, whereby each current phase is carried by a current conductor and each of the N current conductors is disposed adjacent to at least another of the N current conductors, the multiphase current measuring apparatus comprising:
N−1 magnetoresistive gradient sensors, wherein each of the N−1 magnetoresistive gradient sensors is configured for determining a magnetic field strength difference in a measurement plane between currents of two of the N current conductors that are disposed adjacent to each other; and at least one bypass conductor of at least another of the N current conductors that is disposed further and not one of the two of the N current conductors that are disposed adjacent to each other;

wherein the at least one bypass conductor is arranged with respect to the respective magnetoresistive gradient sensor in a manner to compensate a DC field component of the conductor currents of the two of the N current conductors that are disposed adjacent to each other.

2. The multiphase current measuring apparatus according to claim 1, wherein the at least one bypass conductor or a group of bypass conductors is arranged symmetrically with regard to the measurement plane of the respective magnetoresistive gradient sensor, such that a bypass magnetic field generated by the at least one bypass conductor or group of bypass conductors does not bring about a gradient measurement signal of the respective magnetoresistive gradient sensor.

3. The multiphase current measuring apparatus according to claim 1, wherein a current component of a conductor current of the respective N current conductor passable through the at least one bypass conductor of the at least another of the N current conductors is adjustable, by a cross-sectional reduction, an insulation region and/or a resistance region of the portion of the at least another of the N current conductors bypassed by the at least one bypass conductor.

4. The multiphase current measuring apparatus according to claim 1 wherein all the N−1 magnetoresistive gradient sensors are arranged along an axis orthogonal to a longitudinal extent of the N current conductors.

5. The multiphase current measuring apparatus according to claim 4, wherein all the N−1 magnetoresistive gradient sensors are arranged offset relative to the longitudinal extent of the N current conductors.

6. The multiphase current measuring apparatus according to claim 1, further comprising an insulator layer, and the at least one bypass conductor having a feed conductor, wherein the N−1 magnetoresistive gradient sensors are arranged above the insulator layer, the N current conductors and the at least one bypass conductor are arranged below the insulator layer.

7. The multiphase current measuring apparatus according to claim 6, wherein the feed conductor of the at least one bypass conductor extends in different conduction planes below and/or above the measurement plane of the N−1 magnetoresistive gradient sensors and the N current conductors, and in that the at least one bypass conductor substantially extends in a plane of the N current conductors and parallel to the N current conductors.

8. The multiphase current measuring apparatus according to claim 1, wherein a plurality of bypass conductors are arranged horizontally adjacent to each other or are arranged vertically adjacent to each other with regard to the measurement plane or are arranged concentrically to each other in the measurement plane of the respective magnetoresistive gradient sensor.

9. The multiphase current measuring apparatus according to claim 1, wherein the N−1 magnetoresistive gradient sensor comprises an adjustable field compensating device.

10. The multiphase current measuring apparatus according to claim 1, wherein the N current conductors and/or the at least one bypass conductor are individually or jointly comprised in a ferrite structure in order to predetermine a magnetic flux direction.

11. The multiphase current measuring apparatus according to claim 1, wherein N=3.

12. A method of multiphase current measurement for N current conductors that are carrying along N current phases, and each of the N current conductors is disposed adjacent to at least another of the N current conductors, the method comprising:

providing the apparatus of claim 1;

suppressing the DC field component of the conductor currents of the two of the N current conductors that are disposed adjacent to each other by passing a bypass current of the at least another of the N current conductors that is disposed further and not one of the two of the N current conductors that are disposed adjacent to each other, symmetrically to the measurement plane of the magnetoresistive gradient sensor; and using N−1 magnetoresistive gradient sensors for measuring N conductor currents of the N current phases by determining the magnetic field strength difference in the measurement plane between currents of each the two of the N current conductors that are adjacent to each other.

13. The method according to claim 12, wherein the magnitude of the bypass current(s) is adjusted by modifying the resistance of a portion of the N current conductor bypassed by the at least one bypass conductor.

14. The method according to claim 12, wherein a field compensating device of the N−1 magnetoresistive gradient sensors is adjustable for measurement range calibration.

15. The method according to claim 12, wherein the bypass current amounts are selected from the group consisting of less than 20%, less than 10% and less than 5% of the N conductor current.

16. A multiphase current measuring apparatus for a multiconductor current system with a first current conductor, a second current conductor and a third current conductor and at least three current phases, whereby each of the current conductors carries one current phase, the first and second current conductors are adjacent to each other, the second and third current conductors are adjacent to each other, the third current conductor is not adjacent to the first current conductor, the multiphase current measuring apparatus comprising:

a first magnetoresistive gradient sensor configured for determining a magnetic field strength difference in a measurement plane between currents of the first and second current conductors;

a second magnetoresistive gradient sensor configured for determining a magnetic field strength difference in the measurement plane between currents of the second and third current conductors; and a first bypass conductor of the third current conductor arranged with respect to the first magnetoresistive gradient sensor in a manner to compensate a DC field component of the conductor currents of the first and second current conductors.

17. The multiphase current measuring apparatus according to claim 16, further comprising a second bypass conductor of the first current conductor arranged with respect to the second magnetoresistive gradient sensor in a manner to compensate a DC field component of the conductor currents of the second and third current conductors.

* * * * *